US010396045B2

(12) United States Patent
Morrow et al.

(10) Patent No.: US 10,396,045 B2
(45) Date of Patent: Aug. 27, 2019

(54) METAL ON BOTH SIDES OF THE TRANSISTOR INTEGRATED WITH MAGNETIC INDUCTORS

(71) Applicant: Intel Corporation, Santa Clara, CA (US)

(72) Inventors: Patrick Morrow, Portland, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/749,026

(22) PCT Filed: Sep. 27, 2015

(86) PCT No.: PCT/US2015/052532
§ 371 (c)(1),
(2) Date: Jan. 30, 2018

(87) PCT Pub. No.: WO2017/052667
PCT Pub. Date: Mar. 30, 2017

(65) Prior Publication Data
US 2019/0006296 A1    Jan. 3, 2019

(51) Int. Cl.
*H01L 23/64* (2006.01)
*H01L 49/02* (2006.01)
(Continued)

(52) U.S. Cl.
CPC .......... *H01L 23/645* (2013.01); *H01L 21/845* (2013.01); *H01L 23/5384* (2013.01);
(Continued)

(58) Field of Classification Search
CPC .................. H01L 23/645; H01L 28/10; H01L 2924/1206
See application file for complete search history.

(56) References Cited

U.S. PATENT DOCUMENTS 9,716,056 B2 * 7/2017 Leobandung ......... H01L 23/481
2005/0117312 A1   6/2005 Kimura et al.
(Continued)

OTHER PUBLICATIONS

International Preliminary Search Report for International Patent Application No. PCT/US2015/052532, dated Apr. 5, 2018, 11 pages.
(Continued)

*Primary Examiner* — Dung A. Le
(74) *Attorney, Agent, or Firm* — Schwabe, Williamson & Wyatt P.C.

(57) ABSTRACT

An apparatus and a system including an apparatus including a circuit structure including a device stratum including a plurality of transistor devices each including a first side and an opposite second side; an inductor disposed on the second side of the structure; and a contact coupled to the inductor and routed through the device stratum and coupled to at least one of the plurality of transistor devices on the first side. A method including forming a plurality of transistor devices on a substrate, the plurality of transistor devices defining a device stratum including a first side and an opposite second side, wherein the second side is coupled to the substrate; removing a portion of the substrate; forming at least one inductor on the second side of the device stratum; and coupling the at least one inductor to at least one of the plurality of transistor devices.

20 Claims, 14 Drawing Sheets

(51) Int. Cl.
    *H01L 23/538*     (2006.01)
    *H01L 23/00*     (2006.01)
    *H01L 25/065*     (2006.01)
    *H01L 21/84*     (2006.01)
    *H01L 27/12*     (2006.01)

(52) U.S. Cl.
CPC .......... *H01L 24/16* (2013.01); *H01L 25/0657* (2013.01); *H01L 27/1211* (2013.01); *H01L 28/00* (2013.01); *H01L 28/10* (2013.01); *H01L 2924/1206* (2013.01)

(56) References Cited

U.S. PATENT DOCUMENTS

| | | |
|---|---|---|
| 2006/0170527 A1 | 8/2006 | Braunisch |
| 2007/0296002 A1 | 12/2007 | Liang et al. |
| 2012/0187530 A1* | 7/2012 | Zhang .................. H01L 23/645 257/531 |
| 2015/0235952 A1 | 8/2015 | Pan et al. |
| 2015/0255411 A1 | 10/2015 | Karhade et al. |

OTHER PUBLICATIONS

International Search Report and Written Opinion for International Patent Application No. PCT/US2015/052532 dated Jun. 24, 2016, 12 pgs.

* cited by examiner

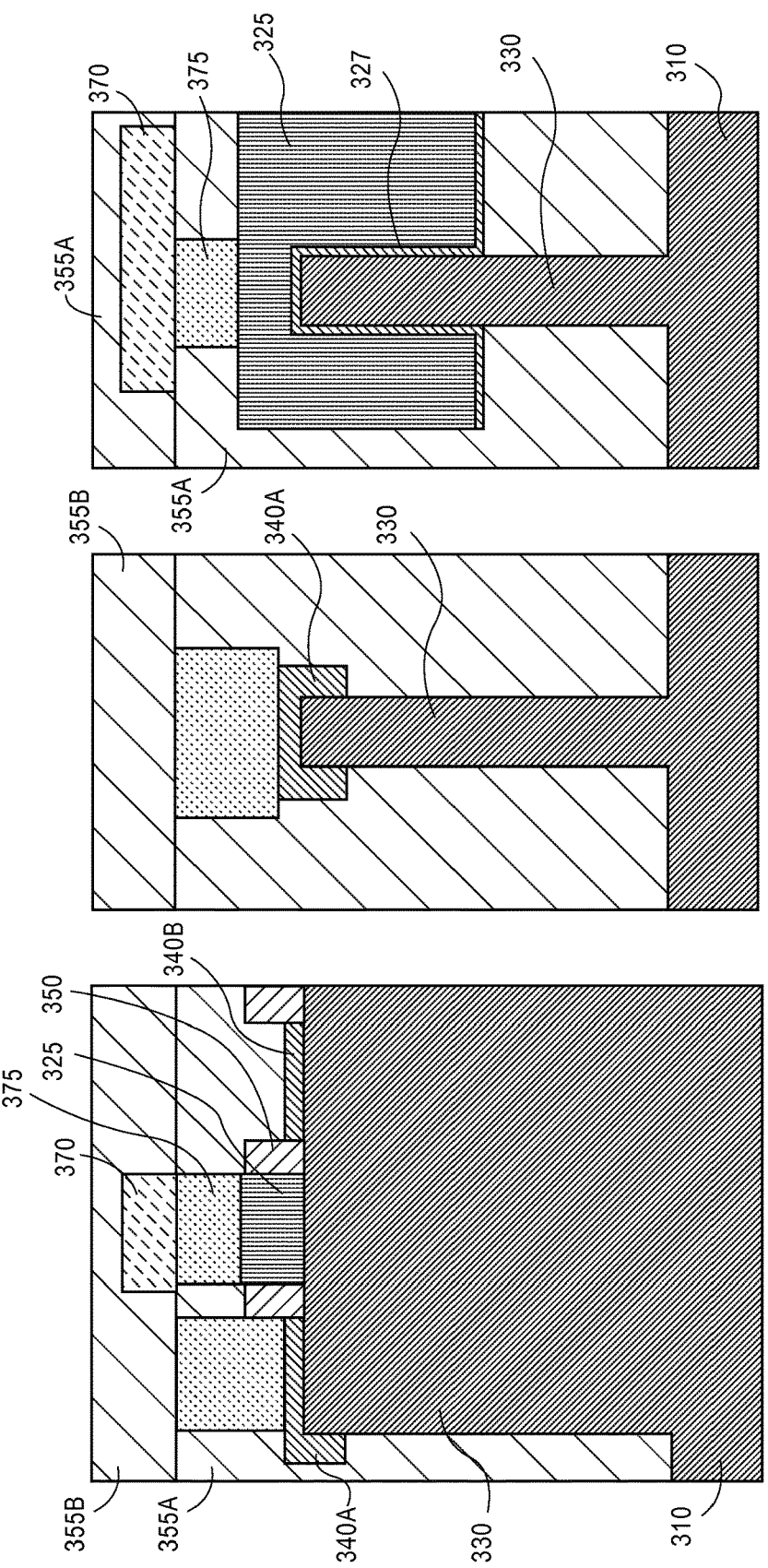

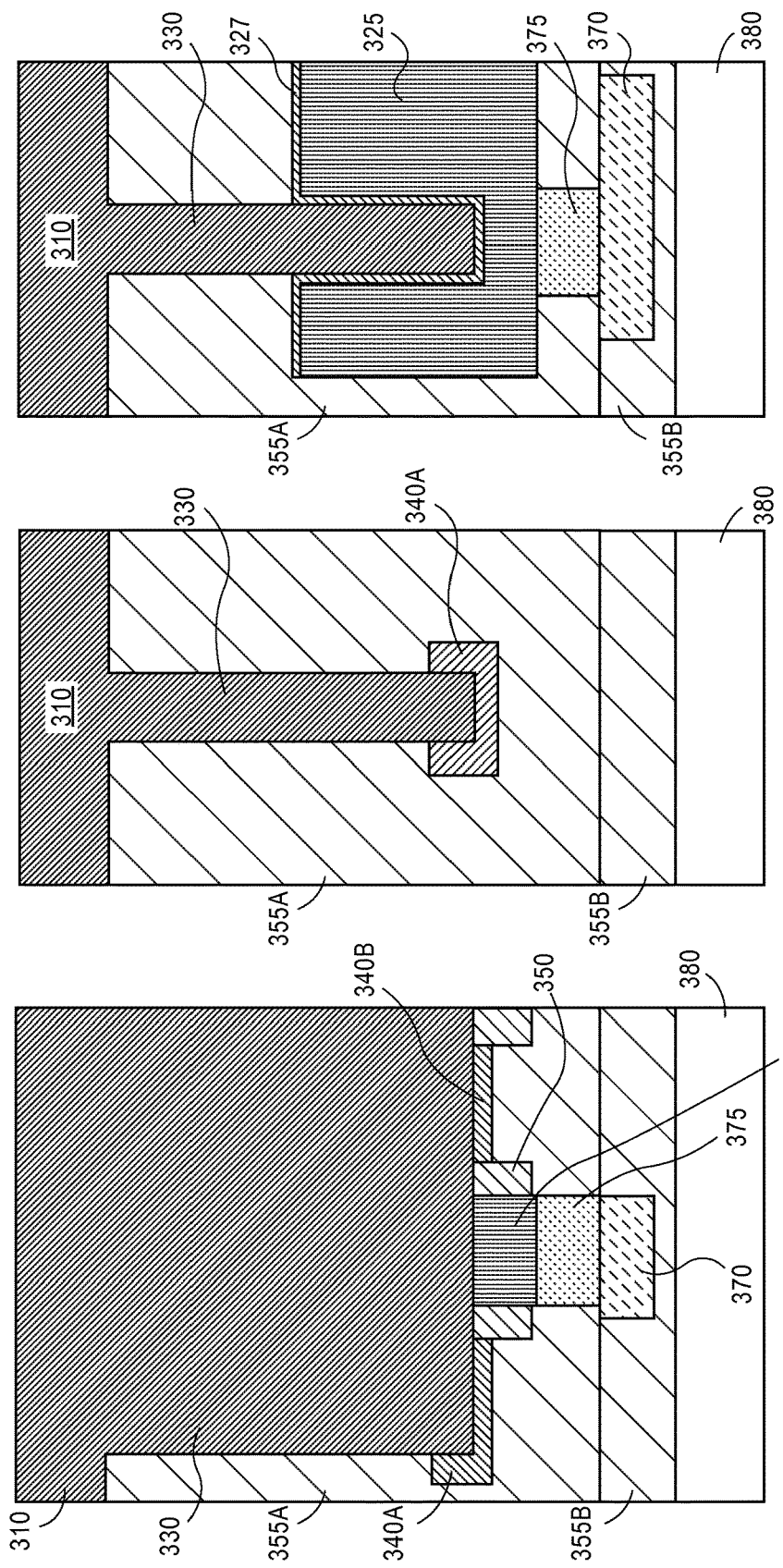

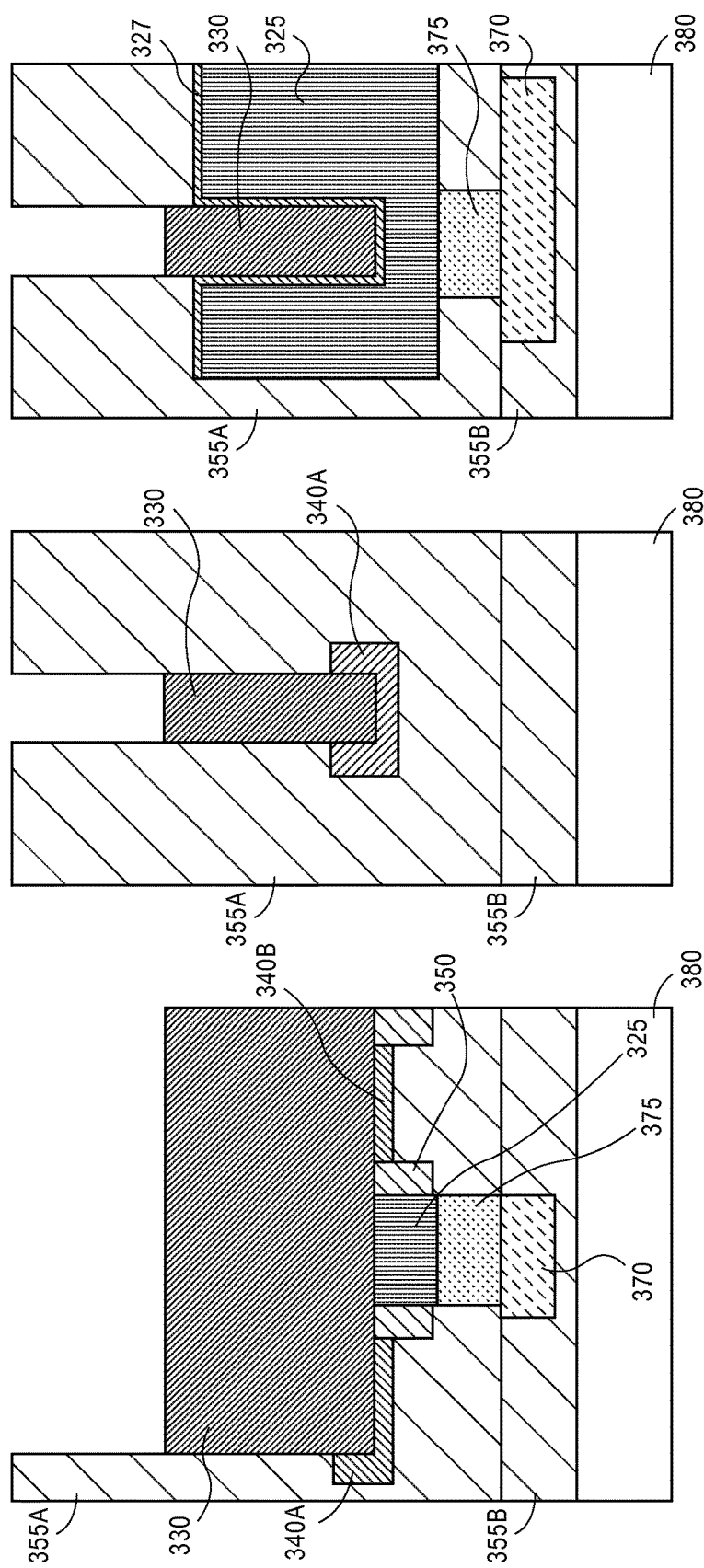

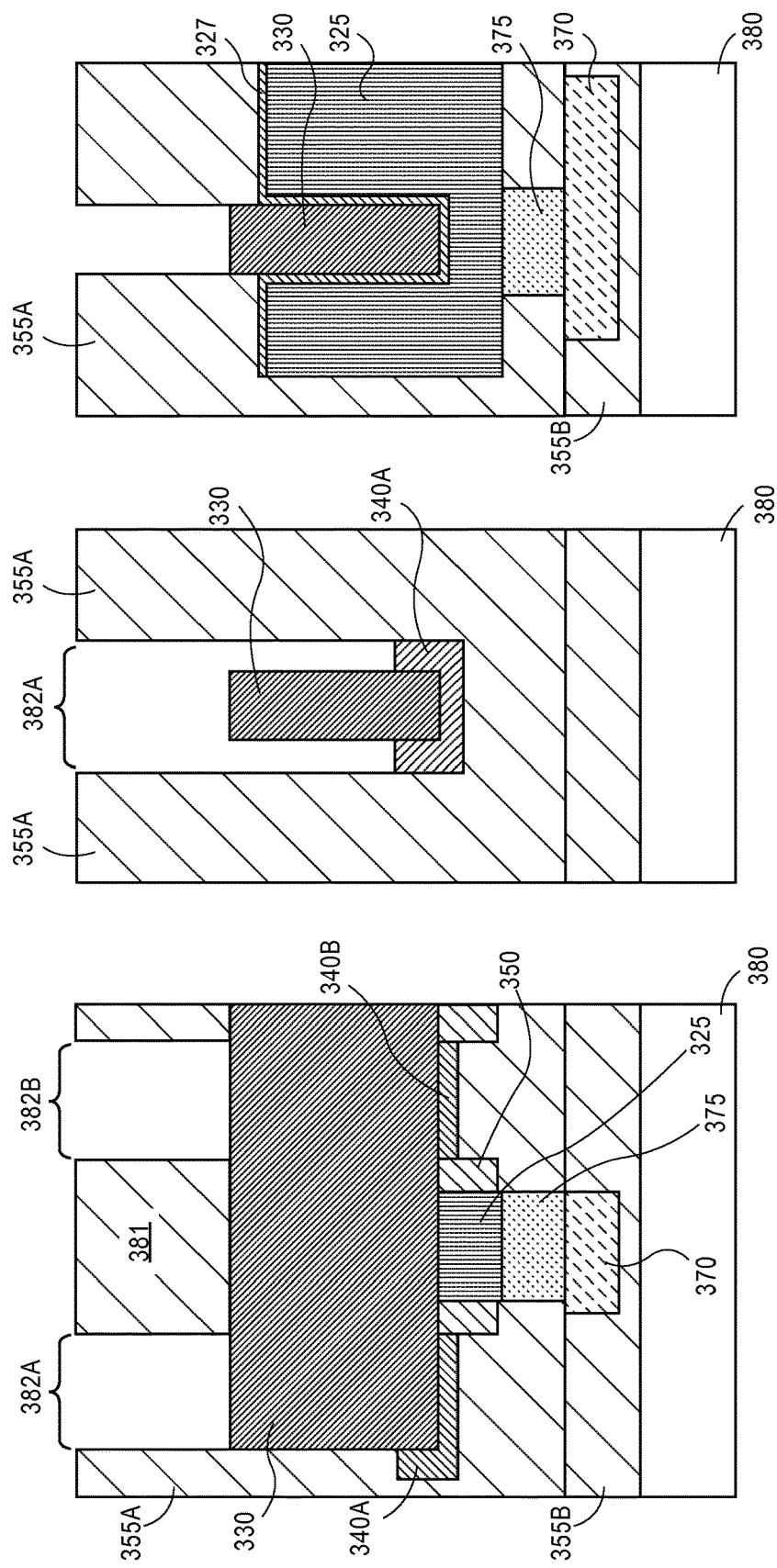

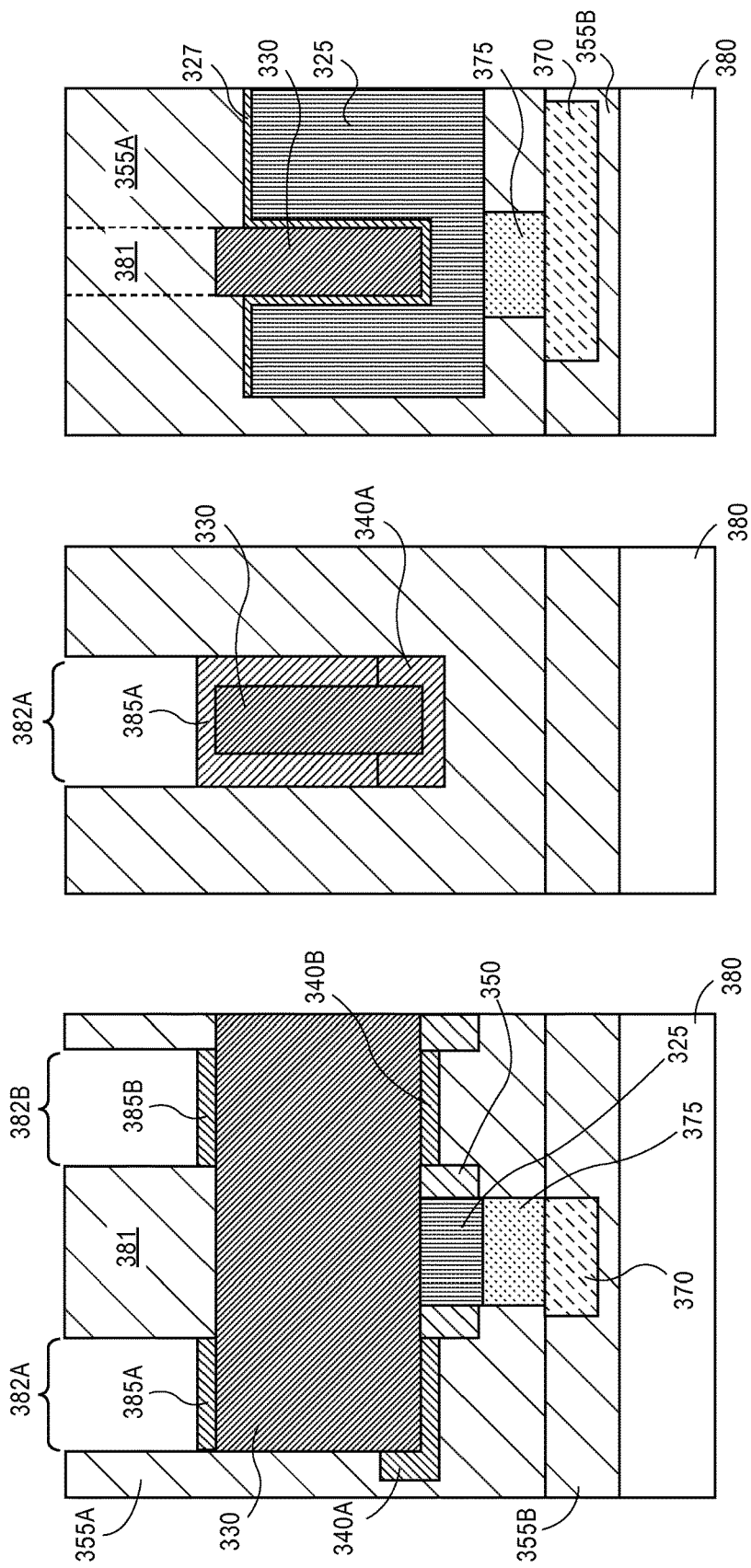

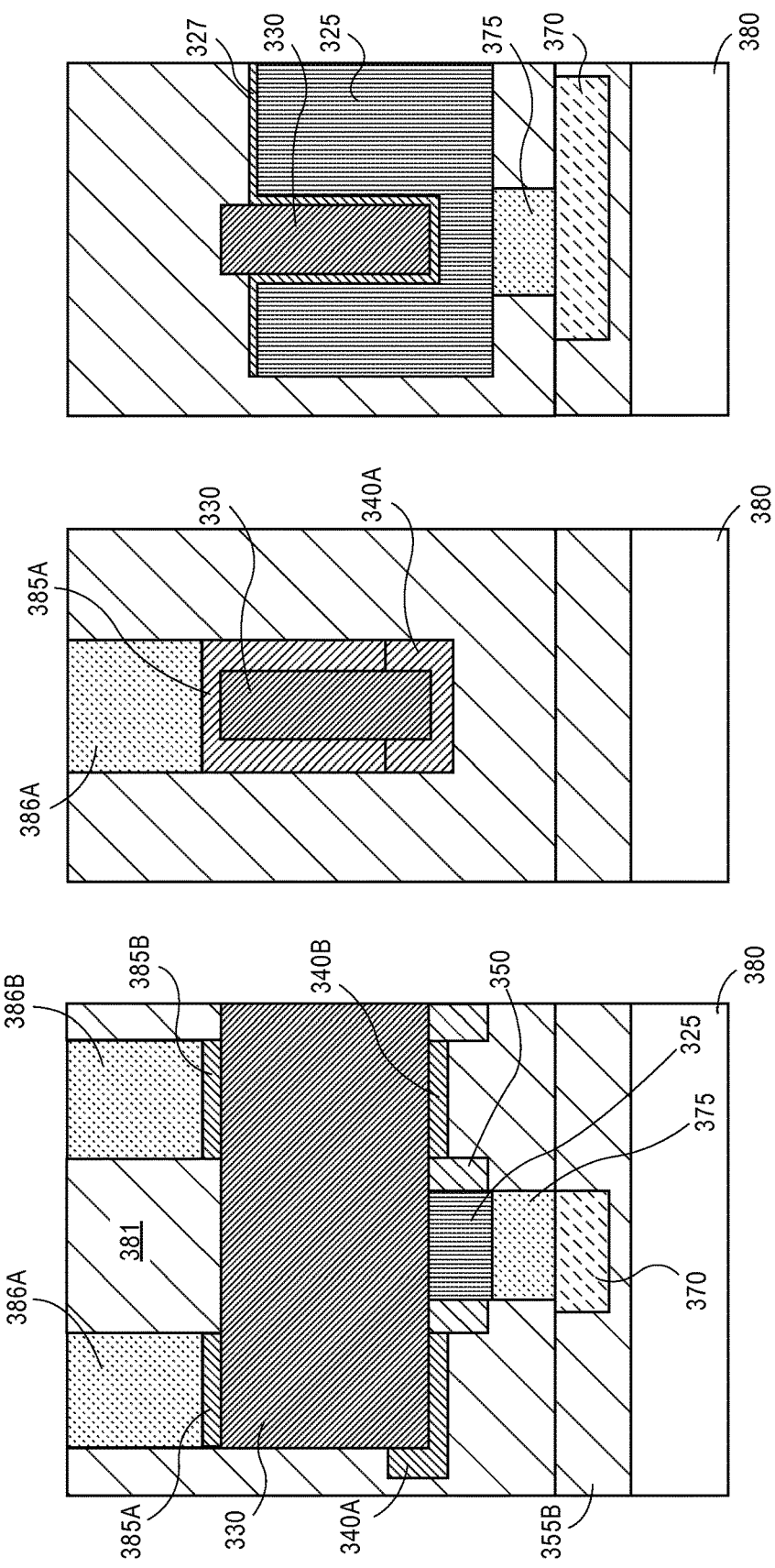

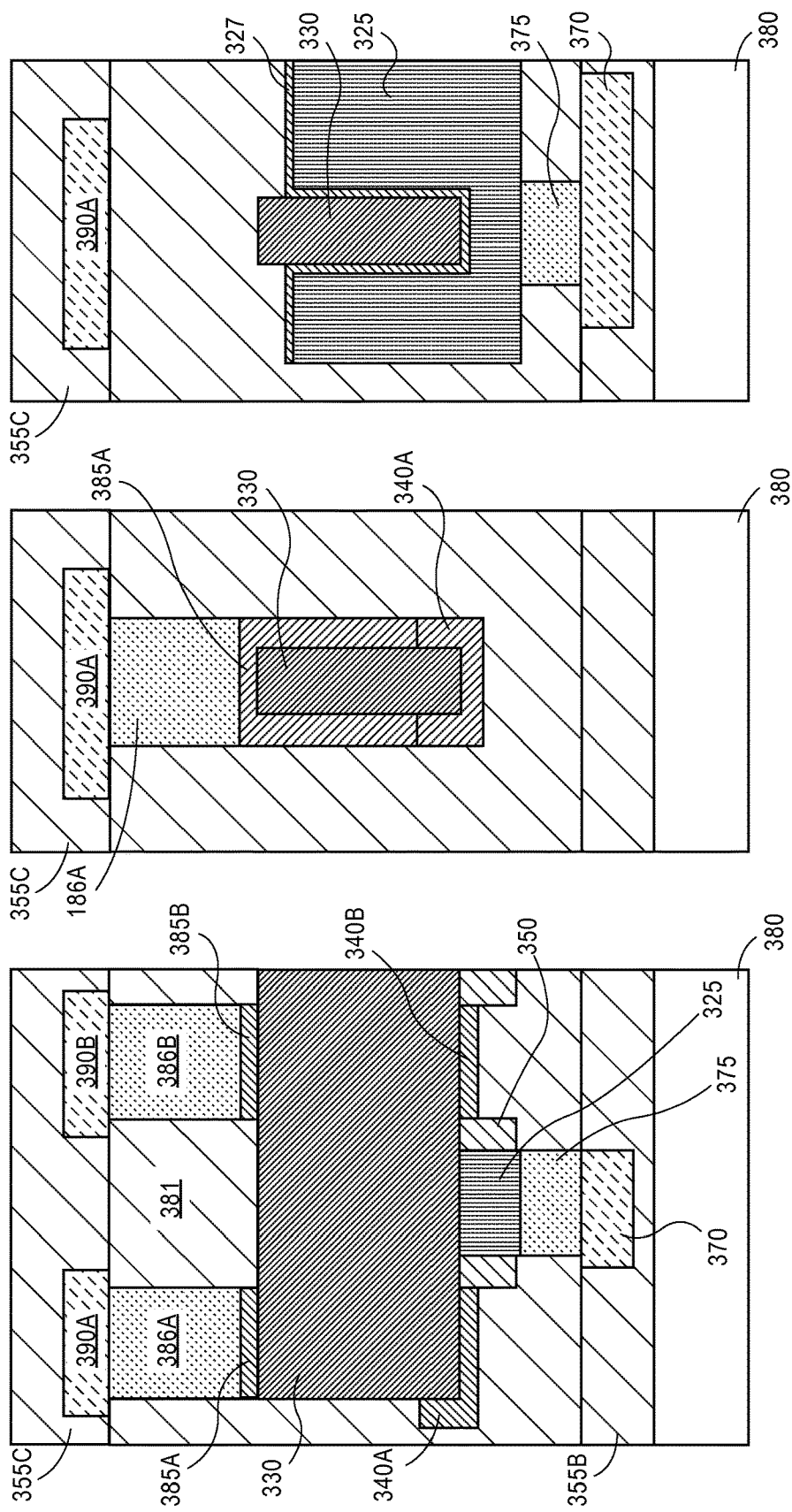

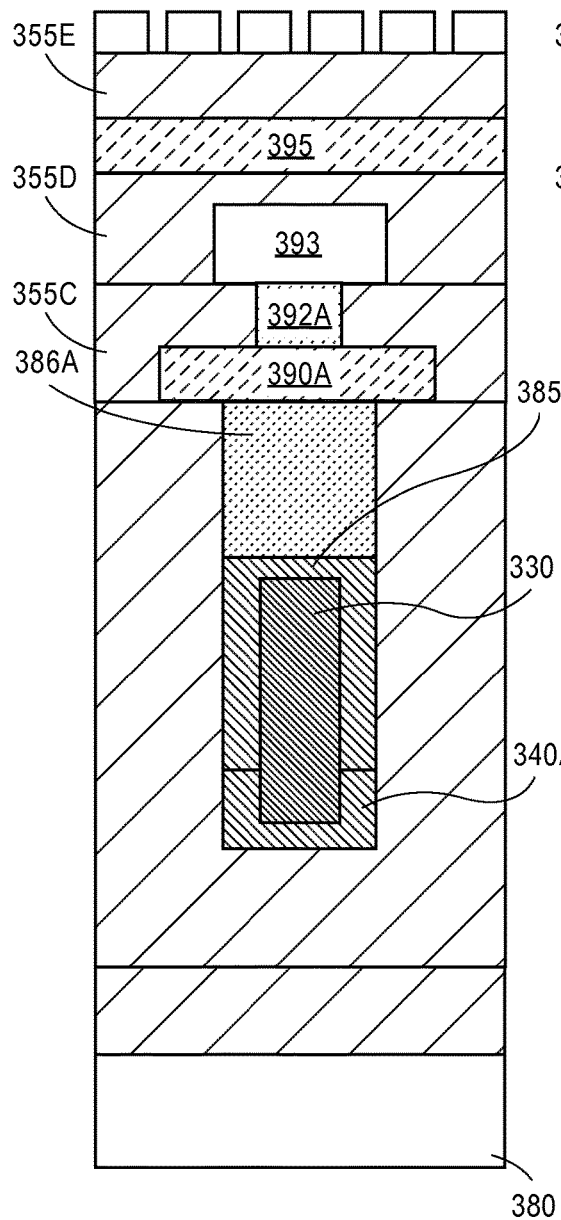
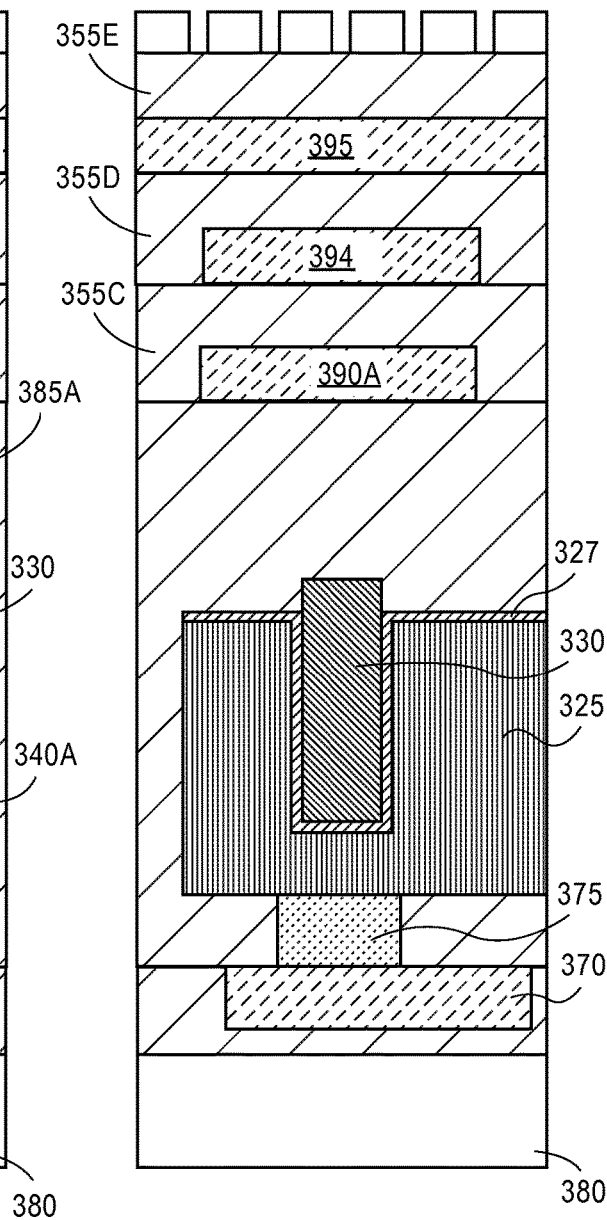
FIG. 11B  FIG. 11C

METAL ON BOTH SIDES OF THE TRANSISTOR INTEGRATED WITH MAGNETIC INDUCTORS

CROSS-REFERENCE TO RELATED APPLICATION

This patent application is a U.S. National Phase Application under 35 U.S.C. § 371 of International Application No. PCT/US2015/052532, filed Sep. 27, 2015, entitled "METAL ON BOTH SIDES OF THE TRANSISTOR INTEGRATED WITH MAGNETIC INDUCTORS," which designates the United States of America, the entire disclosure of which is hereby incorporated by reference in its entirety and for all purposes.

TECHNICAL FIELD

Semiconductor devices including devices including electrical connections from a backside of the device.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Future circuit devices, such as central processing unit devices, will desire both high performance devices and low capacitance, low power devices integrated in a single die or chip.

BRIEF DESCRIPTION OF THE DRAWINGS

FIGS. 4A-4C show cross-sectional side views through the structure of FIG. 2.

FIGS. 5A-5C show the structures of FIGS. 4A-4C following the inverting or flipping of the structure and connection of the structure to a carrier.

FIGS. 6A-6C show the structure of FIGS. 5A-5C following the removal or thinning of the device substrate to expose a second side or backside of a fin of the transistor and following a recessing of the fin.

FIGS. 7A-7C shows the structure of FIGS. 6A-6C following the deposition and patterning of a dielectric material on a backside of a fin.

FIGS. 8A-8C show the structure of FIGS. 7A-7C following an epitaxial growth of a material for a backside junction formation.

FIGS. 9A-9C show the structure of FIGS. 8A-8C following the filling of the via openings in the dielectric material with a conductive contact material such as a tungsten.

FIGS. 10A-10C shows the structure of FIGS. 9A-9C and show the interconnect connected to a contact to a source and the interconnect connected to a contact to a source as part of, for example, a first backside interconnect or metal layer.

FIGS. 11A-11C show the structure of FIGS. 10A-10C following the forming of an inductor and multiple interconnect layers on the structure and contact points for connection of the structure to an external substrate.

DETAILED DESCRIPTION

The embodiments described herein are directed to semiconductor devices including non-planar semiconductor devices (e.g., three-dimensional devices) including one or more inductors (e.g., magnetic inductors) and one or more interconnects or wiring on an underside or backside of the devices. In one embodiment, an apparatus includes a circuit structure including a device stratum including a plurality of transistor devices each including a first side and an opposite second side; an inductor disposed on the second side of the structure; and a contact connected to the inductor and routed through the device stratum and connected to at least one of the number of transistor devices on the first side. In another embodiment, a system is disclosed including a package substrate including a supply connection and a die connected to the package substrate. The die, in one embodiment, includes at least one inductor connected to a second side (backside or underside) of a device stratum.

With regard to suitable inductors to be connected to a second side of a device stratum of a die, in one embodiment, the inductor is a magnetic inductor. One application of an inductor (e.g., a magnetic inductor) related to signal processing is as a voltage regulator. On-die voltage regulation can be used to locally change the voltage, e.g., within core voltage changes, for active power management. On-die voltage regulation can also be designed to automatically maintain a constant voltage level for an associated semiconductor die. In another application, on-die voltage regulation can be used to throttle voltages in real time if active power management required. Another inductor application is in radio frequency (RF) circuits where, for example, an inductor in conjunction with a capacitor forms a tuned circuit that acts as a resonator for oscillating current.

Figure 1:
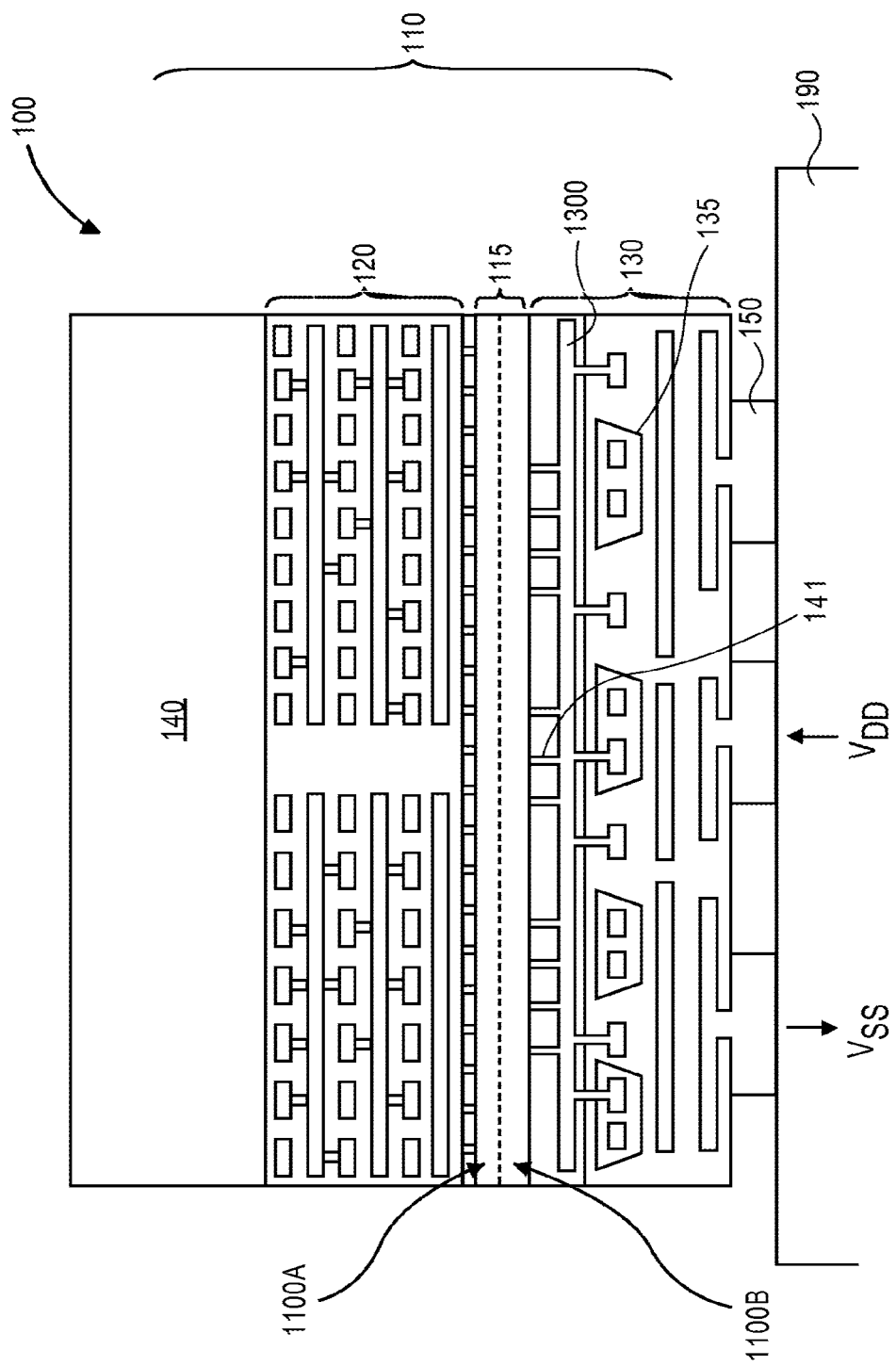
FIG. 1 shows a cross-sectional schematic side view of an embodiment of an assembly including an integrated circuit chip or die connected to a package substrate.

FIG. 1 shows a cross-sectional schematic side view of one embodiment of an assembly including an integrated circuit chip or die connected to a package substrate. Assembly 100 includes die 110 that includes device layer or stratum 115 including a number of devices (e.g., transistor devices). Device stratum 115 includes first side 1100A representing a first side of the stratum and second side or backside 1100B opposite first side 1100A. The transistor devices include logic circuitry and optionally one or more power transistors. Connected to device stratum 115 of die 110 on a first side are interconnects 120 that, in one embodiment, include, but are not limited to, a number of conductive metal lines connected to devices of device stratum 115 from first side 1100A. Included among the interconnects are control circuitry interconnects. Disposed above signal wiring 120, as viewed, is carrier substrate 140. In one embodiment, as will be described below, carrier substrate 140 is bonded to signal wiring 120 in a process of forming die 110 with metallization on both sides of the logic circuitry. Connected to devices of die 110 through second side 1100B of the device stratum 115, in this embodiment, are interconnects 130 and one or more inductors 135 (e.g., magnetic inductors). In one embodiment, interconnects 130 include power interconnects ($V_{DD}$, $V_{DD}$-gated and $V_{SS}$) in one of more rows of metallization. In one embodiment, one or more inductors function as voltage regulators and are connected to power interconnects ($V_{DD}$, $V_{DD}$-gated) that bring power to logic circuitry on first side 1100A of device stratum 115. FIG. 1 shows inductors 135 connected to interconnect 1300 on a second side 1100B of device stratum 115 and contacts 141 also connected to interconnects 130. Contacts 141 include contacts to transistor devices from second side 1100B of device stratum 115. FIG. 1 also shows ones of interconnects 1300 are connected to contact points (e.g., C4 bumps) 150 that are operable to connect die 110 to package 190. FIG. 1 further shows $V_{DD}$ and $V_{SS}$ connections to die 110 through package substrate 190.

Figure 2:
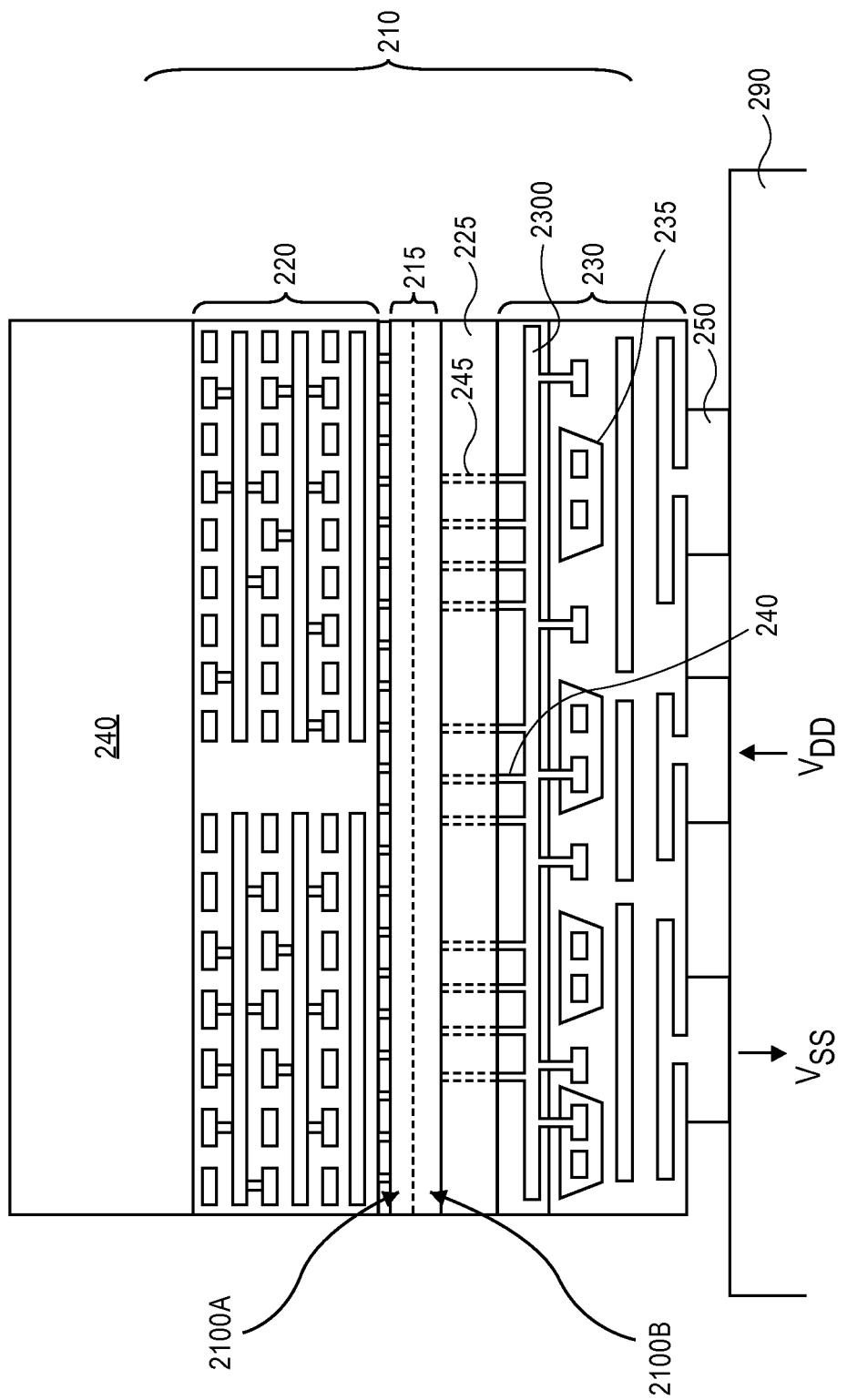
FIG. 2 shows a cross-sectional schematic side view of another embodiment of an assembly including an integrated circuit chip or die connected to a package substrate.

FIG. 2 shows a cross-sectional schematic side view of another embodiment of an assembly including an integrated circuit chip or die connected to a package substrate. Assembly 200 includes die 210 that includes device layer or stratum 215 including a number of devices (e.g., transistor devices). Device stratum 215 includes first side 2100A representing a first side of the stratum and second side or backside 2100B opposite first side 2100A. In this embodiment, second side 2100B of device stratum 215 is connected to substrate 225. Substrate 225 is, for example, a semiconductor material such as silicon. The transistor devices include logic circuitry and optionally one or more power transistors. Connected to device stratum 215 of die 210 on a first side are interconnects 220 that, in one embodiment, include, but are not limited to, a number of conductive metal lines connected to devices of device stratum 215 from first side 2100A. Included among the interconnects are control circuitry interconnects. Disposed above signal wiring 220, as viewed, is carrier substrate 240. In one embodiment, carrier substrate 240 is bonded to signal wiring 220 in a process of forming die 210 with metallization on both sides of the logic circuitry. Connected to devices of die 210 through second side 2100B of the device stratum, in this embodiment, are one or more inductors 235 (e.g., magnetic inductors) and interconnects 230. In one embodiment, one or more inductors 235 are voltage regulators and interconnects 230 include power interconnects ($V_{DD}$, $V_{DD}$-gated and $V_{SS}$). In one embodiment, one or more inductors function as voltage regulators and are connected to power supply interconnects ($V_{DD}$ or $V_{DD}$-gate) that bring power to logic circuitry on first side 2100A of device stratum 215. FIG. 2 also shows inductors 235 connected to contacts 240. Contacts 240 are connected in turn to through silicon vias (TSVs) 245 that are connected to devices (e.g., a backside of devices) of device stratum 215. FIG. 2 also shows ones of such interconnects 230 are connected to contact points (e.g., C4 bumps) 250 that are operable to connect die 210 to package 290. FIG. 2 further shows $V_{DD}$ and $V_{SS}$ connections to die 210 through package substrate 290.

FIGS. 3-11C describe a method or process of forming a die similar to die 110 in FIG. 1 including one or more inductors (e.g., magnetic inductors) implemented on a backside of a single device stratum utilizing non-planar multi-gate semiconductor devices including electrical connections on a non-device side or backside of the stratum (underneath the devices). Such electrical connections include power wires $V_{DD}$, $V_{DD}$-gated, and $V_{SS}$. Signal wiring (control wiring), in this embodiment, is disposed above the devices. In one embodiment, the devices used in the device stratum are three-dimensional metal oxide semiconductor field effect transistors (MOSFETs). It is appreciated that in other embodiments, other forms of devices (e.g., planar devices, nanowires) may be utilized.

Figure 3:
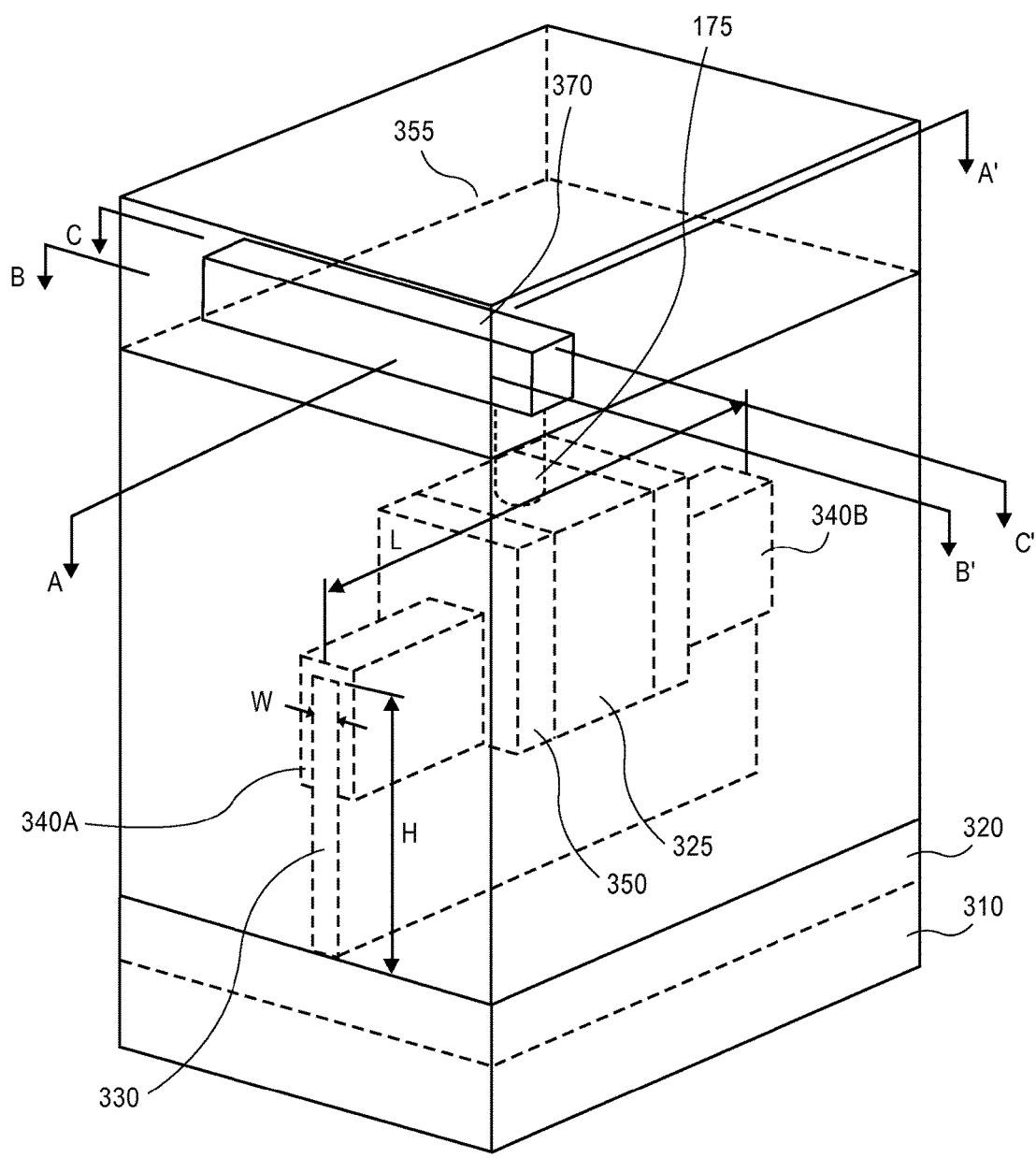
FIG. 3 shows a top side perspective view of a portion of a semiconductor or semiconductor-on-insulator (SOI) substrate that is, for example, a portion of an integrated circuit die or chip on a wafer and illustrates a three-dimensional transistor device formed thereon with an interconnect to the gate electrode of the transistor.

FIG. 3 shows a top side perspective view of a portion of a semiconductor or semiconductor-on-insulator (SOI) substrate that is, for example, a portion of an integrated circuit die or chip on a wafer. Specifically, FIG. 3 shows structure 300 including substrate 310 of silicon or SOI. Overlaying substrate 310 is optional buffer layer 320. In one embodiment, a buffer layer is a silicon germanium buffer introduced, in one embodiment, on substrate 310 by a growth technique. Representatively, buffer layer 320, if present, has a representative thickness on the order of a few hundred nanometers (nm).

Disposed on a surface of substrate 310 and optional buffer layer 320 in the embodiment illustrated in FIG. 3 (an upper surface as viewed), is a portion of a transistor device such as an N-type transistor device or a P-type transistor device. Common to an N-type or P-type transistor device, in this embodiment, is body or fin 330 disposed on a surface of buffer layer 320. In one embodiment, fin 330 is formed of a semiconductor material such as silicon, silicon germanium or a group III-V or group IV-V semiconductor material. In one embodiment, a material of fin 330 is formed according to conventional processing techniques for forming a three-dimensional integrated circuit device. Representatively, a semiconductor material is epitaxially grown on the substrate and then formed into fin 330 (e.g., by a masking and etch process).

In one embodiment, fin 330 has a length dimension, L, greater than a height dimension, H. A representative length range is on the order of 10 nanometers (nm) to 1 millimeter (mm), and a representative height range is on the order of 5 nm to 200 nm. Fin 330 also has a width, W, representatively on the order of 4-10 nm. As illustrated, fin 330 is a three-dimensional body extending from or on a surface of substrate 310 (or optionally from or on buffer layer 320). The three-dimensional body as illustrated in FIG. 3 is a rectangular body with opposing sides (first and second sides) projecting from a surface of buffer layer 320 as viewed. It is appreciated that in processing of such bodies, a true rectangular form may not be achievable with available tooling, and other shapes may result. Representative shapes include, but are not limited to, a trapezoidal shape (e.g., base wider than top) and an arch shape.

Disposed on fin 330 in the embodiment of a structure of FIG. 3 is a gate stack. In one embodiment, a gate stack includes a gate dielectric layer of, for example, silicon dioxide or a dielectric material having a dielectric constant greater than silicon dioxide (a high k dielectric material). Disposed on the gate dielectric layer, in one embodiment, is gate 325 of, for example, a metal. The gate stack may include spacers 350 of dielectric material on opposite sides thereof. A representative material for spacers 350 is a low k material such as silicon nitride (SiN) or silicon carbon nitrogen (SiCN). FIG. 3 shows spacers 350 adjacent the sidewalls of the gate stack and on the fin 330. Formed on or in fin 330 on opposite sides of the gate stack are junction regions (source 340A and drain 340B).

In one embodiment, to form the three-dimensional transistor structure, a gate dielectric material is formed on fin 330 such as by way of a blanket deposition followed by a blanket deposition of a sacrificial or dummy gate material. A mask material is introduced over the structure and patterned to protect the gate stack material (gate stack with sacrificial or dummy gate material) over a designated channel region. An etch process is then used to remove the gate stack material in undesired areas and pattern the gate stack over a designated channel region. Spacers 350 are then formed. One technique to form spacers 350 is to deposit a film on the structure, protect the film in a desired area and then etch to pattern the film into desired spacer dimensions.

Following the formation of a gate stack including a sacrificial or dummy gate material on fin 330 and spacers 350, junction regions (source and drain) are formed on or in fin 330. The source and drain are formed in or on fin 330 on opposite sides of the gate stack (sacrificial gate electrode on gate dielectric). In the embodiment shown in FIG. 3, source 340A and drain 340B are formed by epitaxially growing source and drain material as a cladding on a portion of fin 330. Representative material for source 340A and drain 340B includes, but is not limited to, silicon, silicon germanium, or a group III-V or group IV-V compound semiconductor material. Source 340A and drain 340B may alternatively be formed by removing portions of the fin material and epitaxially growing source and drain material in designated junction regions where fin material was removed.

Following the formation of source 340A and drain 340B, in one embodiment, the sacrificial or dummy gate is removed and replaced with a gate electrode material. In one embodiment, prior to removal of the sacrificial or dummy gate stack, a dielectric material is deposited on the structure. In one embodiment, dielectric material is silicon dioxide or a low k dielectric material deposited as a blanket and then polished to expose sacrificial or dummy gate 325. The sacrificial or dummy gate and gate dielectric are then removed by, for example, an etch process.

Following a removal of the sacrificial or dummy gate and gate dielectric, a gate stack is formed in a gate electrode region. A gate stack is introduced, e.g., deposited, on the structure including a gate dielectric and gate electrode. In an embodiment, gate electrode 325 of the gate electrode stack is composed of a metal gate and a gate dielectric layer is composed of a material having a dielectric constant greater than a dielectric constant of silicon dioxide (a high-K material). For example, in one embodiment, gate dielectric layer 327 (see FIGS. 4A-4C) is composed of a material such as, but not limited to, hafnium oxide, hafnium oxynitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In one embodiment, gate electrode 325 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. Following the formation of the gate stack, additional dielectric material dielectric material of silicon dioxide or a low k dielectric material is deposited on the three-dimensional transistor device (e.g., on ILD0) to encapsulate or embed the device structure in dielectric material. FIG. 3 shows dielectric material 355A encapsulating the three-dimensional transistor device (e.g., as an ILD0).

FIG. 3 shows the structure following the forming of interconnects to the three-dimensional transistor device structure. In this embodiment, an electrical connection is made as a first interconnect layer or metal layer to gate electrode 325. Representatively, to form an electrical contact to gate electrode 375, an opening is initially formed to the gate electrode by, for example, a masking process with an opening in a mask to gate electrode 325. Dielectric material 355A is etched to expose the gate electrode and then the masking material removed. Next, a contact material of, for example, tungsten is introduced in the opening and the opening is filled to form contact 375 to gate electrode 325. A surface of dielectric material 355A (a top surface as viewed) may then be seeded with a conductive seed material and then patterned with masking material to define an opening for an interconnect path with the opening exposing contact 375. A conductive material such as copper is then introduced by way of an electroplating process to form interconnect 370 connected to contact 375 of gate electrode 325. The masking material and unwanted seed material can then be removed. Following the formation of interconnects as an initial metal layer, dielectric material 355B of for example, silicon dioxide or a low k dielectric material may be deposited as an ILD1 layer on and around the interconnects. Additional interconnect layers may then be formed according to conventional processes. FIG. 2 shows signal wiring 220 of die 210 comprised of several layers of interconnect. Interconnect 370 in FIG. 3 is representative of one, for example, a first of such layers nearest the device layer.

FIGS. 4A-4C show cross-sectional side views through the structure of FIG. 2. Specifically, FIG. 4A shows a cross-section through line A-A' through fin 330; FIG. 4B shows a cross-section through line B-B' through source 340A; and FIG. 4C shows a cross-sectional side view through line C-C' through gate electrode 325.

FIGS. 5A-5C show the structures of FIGS. 4A-4C following the inverting or flipping of the structure and connection of the structure to a carrier. FIGS. 5A-5C represent cross-sections through fin 330, drain 340B, and gate electrode 325, respectively, as described above with respect to FIGS. 4A-4C. Referring to FIGS. 5A-5C, in this embodiment, structure 300 is flipped and connected to carrier 380. Carrier 380 is, for example, a semiconductor wafer. Structure 300 may be connected to carrier 380 through an adhesive or other bonding technique.

FIGS. 6A-6C show the structure of FIGS. 5A-5C following the removal or thinning of substrate 310 to expose a second side or backside of fin 330. In one embodiment, substrate 310 may be removed by a thinning process, such as a mechanical grinding or etch process. In this embodiment, substrate 310 is completely removed to expose a second side or backside of fin 330. To form a die such as die 210 in FIG. 2, substrate 310 would be thinned but a portion would remain. FIGS. 6A-6C show fin 330 exposed from a second side or backside of the structure. Following exposure of fin 330, the fin may optionally be recessed. FIGS. 6A-6C show the structure following a recessing of fin 330. In one embodiment, to recess fin 330, an etch process may be utilized with an etchant selective toward a removal of fin material relative to dielectric material 355A. Alternatively, a masking material may be patterned on a surface of dielectric material 355A (an exposed backside surface) with an opening that exposes fin 330. A material of fin 330 may be removed to recess fin 330 by, for example, an etch process, and then the masking material removed.

FIGS. 7A-7C shows the structure of FIGS. 6A-6C following the deposition and patterning of a dielectric material on a backside of fin 330. FIGS. 7A-7C show dielectric material 381 of, for example, a silicon dioxide or a low K dielectric material deposited by, for example, a blanket deposition process. Once deposited, dielectric material 381 may be patterned by, for example, forming a masking material on a surface of dielectric material 380 with openings or vias opposite, for example, source and drain regions on an opposite side of fin 330. FIG. 7A shows opening 382A through dielectric material 381 oriented on a backside of fin 330 corresponding to a source region of the fin (source 340A) and opening 382B through dielectric material 381 oriented to a drain region of the fin (drain 340B). FIG. 7B shows that, in this embodiment, the openings (e.g., opening 382A) have dimensions for a diameter that is greater than a width dimension of fin 330. In this manner, a backside of fin 330 as well as side walls of fin 330 are exposed. FIG. 7B also shows that the etch proceeds through the structure to expose a backside of source 340A.

FIGS. 8A-8C show the structure of FIGS. 7A-7C following an epitaxial growth of a material for a backside junction formation. An example of a material is a semiconductor material such as silicon germanium or a group III-V or group IV-V semiconductor material. FIG. 8A shows epitaxially grown material 385A in opening 382A in a region aligned with a backside of source 340A and epitaxially grown material 385B in opening 382B on fin 330 aligned with a backside of drain 340B. FIG. 8B shows material 385A epitaxially grown on the side walls of fin 330 and connecting with source 340A previously formed on a first side or device side of the structure.

FIGS. 9A-9C show the structure of FIGS. 8A-8C following the filling of the via openings in dielectric material 380 with a conductive contact material such as a tungsten.

FIG. 9A shows contact 386A to epitaxial material 385B associated with source 340A and contact metal 386B to epitaxial material 385B associated with drain 340B. FIG. 9B shows contact metal 386B to epitaxial material 385B. FIGS. 9A and 9B also show the connection to source 340A (via contact material) from a backside or second side of the structure an underside of the device stratum. Interconnects may now be formed to contacts 386A and 386B by, for example, the technique described above with respect to device side interconnects (see FIGS. 3 and 4A-4C and the accompanying text).

The above description of forming backside junction (source and drain) contacts is one embodiment. It is appreciated that there are other methods rather than an epitaxial growth of a material on the fin. Other embodiments include, but are not limited to, modifying regions of the fin from the backside by, for example, driving in dopants. In another embodiment, the sidewalls of fin 330 may be exposed in source an drain regions and a contact material such as tungsten may be introduced on such sidewalls. Where contact material is also formed on a device side of the source and drain (e.g., forming such contacts at the time of forming contact 375 to gate electrode 325), the contact may be extended in a backside processing operation to form a wrap-around contact to the source and drain, respectively.

FIGS. 10A-10C shows the structure of FIGS. 9A-9C and show interconnect 390A connected to contact 396A to source 340A and interconnect 390B connected to contact 386B to source 340B as part of, for example, a first backside interconnect or metal layer. FIGS. 10A-10C also show the structure following the deposition of dielectric material 355C of silicon dioxide or a low k dielectric material on the interconnect or metal layer.

In one embodiment, a first backside interconnect or metal layer including interconnect 390A and interconnect 390B is part of or is connected to a power grid underneath or on a backside (second side) of the device stratum. Representatively, where the transistor described with reference to FIGS. 3-10C is a power gate transistor, source 340A is connected to $V_{DD}$ and drain 340B is connected to $V_{DD}$-gated.

Figure 11A:
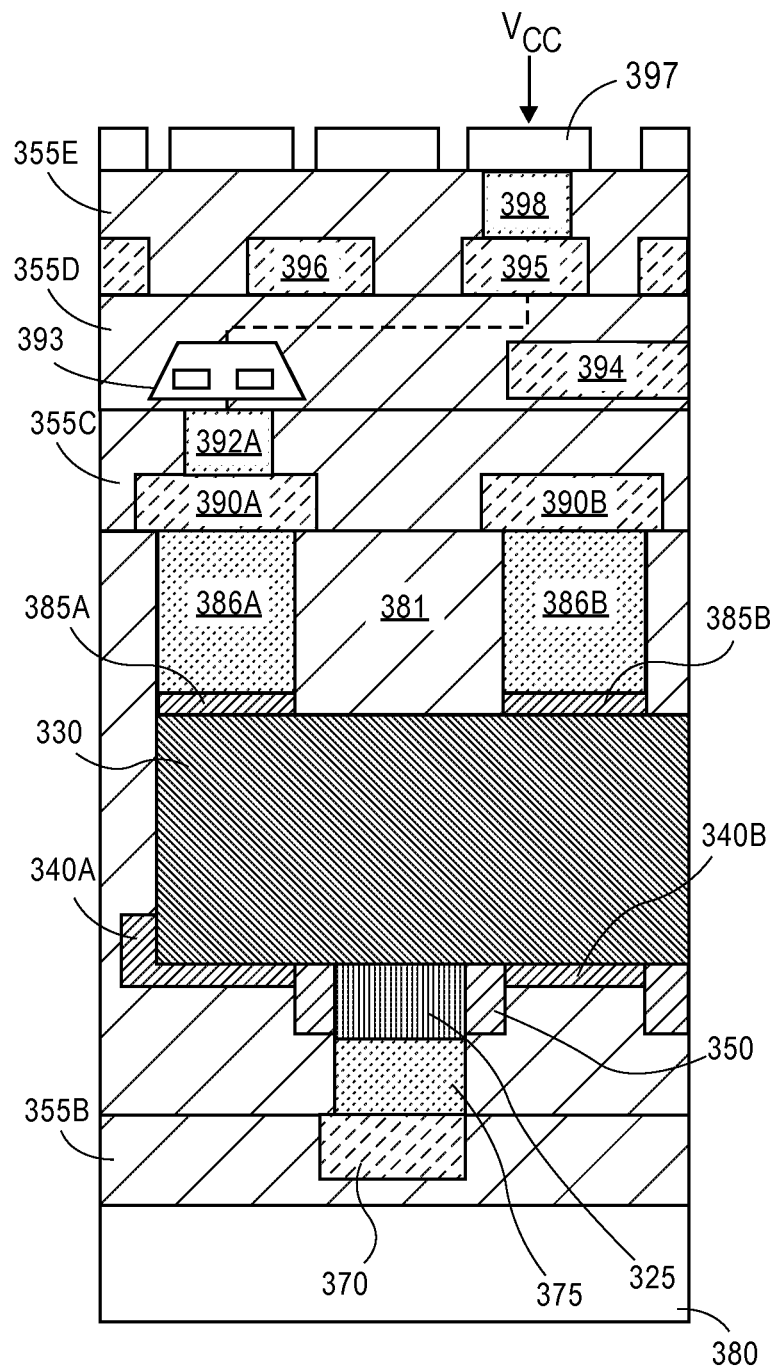

FIGS. 11A-11C show the structure of FIGS. 10A-10C following the forming of a magnetic inductor and multiple interconnect layers on the structure and contact points for connection of the structure to an external substrate. Disposed on a surface of dielectric material 355C is interconnect 390A that is, in one embodiment, a $V_{DD}$ line connected to source 340A and interconnect line 390B that is, for example, a $V_{DD}$-gated line connected to drain 340B. Overlying interconnect 390A and interconnect line 390B, as viewed, is dielectric material 355C.

FIGS. 11A and 11B show magnetic inductor 393 formed on a surface of dielectric material 355C. Magnetic inductors are components that are able to store energy in a magnetic field created, for example, by electric current passing through one or more wires. It is appreciated that there are a variety of ways to form a magnetic inductor. Spiral and stripe magnetic inductors are non-limiting examples of an on-chip inductor. Such inductors may be formed by electroplating an electrically conductive material such as copper (e.g., 5 µm) and two levels of a magnetic material with magnetic vias (e.g., 2 µm thick each layer) on a seed pattern on a surface of dielectric material 355C. Representative magnetic materials include, but are not limited to, cobalt zirconium tantalum (CoZrTa) cobaltniobiumtantalum (CoNbTa), nickel iron (NiFe), cobalt phosphorous (CoP), and cobalt phosphorous boron (CoPB). Initially, a level of magnetic material is electroplated on the dielectric layer followed by the electrically conductive material (e.g., copper), a polyimide layer and then the second level of magnetic material. Such inductor may be connected to interconnects such as interconnect 390A (to source 340A) through a conductive via 392 (e.g., using a magnetic via from the inductor to connect to the via).

As noted, FIGS. 11A-11C also show the structure of FIGS. 10A-10C following the forming of multiple interconnect layers and contact points for connection of the structure to an external source. The interconnects of such layers may be formed by an electroplating process. In one embodiment, such interconnects of a conductive material such as copper may be doped with a dopant to improve electromigration. As previously described, FIG. 11A shows interconnect 390A that is, in one embodiment, a $V_{DD}$ line connected to source 340A and interconnect line 390B that is, for example, a $V_{DD}$-gated line connected to drain 340B. FIG. 11A also shows second level interconnect 394 that may be a second level $V_{DD}$ line or other line. Similarly, interconnect line 390B is connected to a second backside interconnect layer that is a $V_{DD}$-gated line that is, for example, connected to one or more other transistor devices (e.g., connected to a source of one or more transistor through an underside or backside connection that make up core logic). Interconnect 390A is shown connected to magnetic inductor 393 and the inductor is connected to third level interconnect 395 that is, for example, a third backside level $V_{DD}$ line. Third level backside interconnect 395 is connected through contact 395 to contact point 397 operable to bring power ($V_{DD}$) to the structure. As illustrated, each of the interconnect levels is separated from an adjoining level by dielectric material (dielectric material 355C, dielectric material 355D, and dielectric material 355E). Contact points 397 are, for example, C4 bumps operable to connect the structure to a substrate such as a package substrate.

Figure 12:
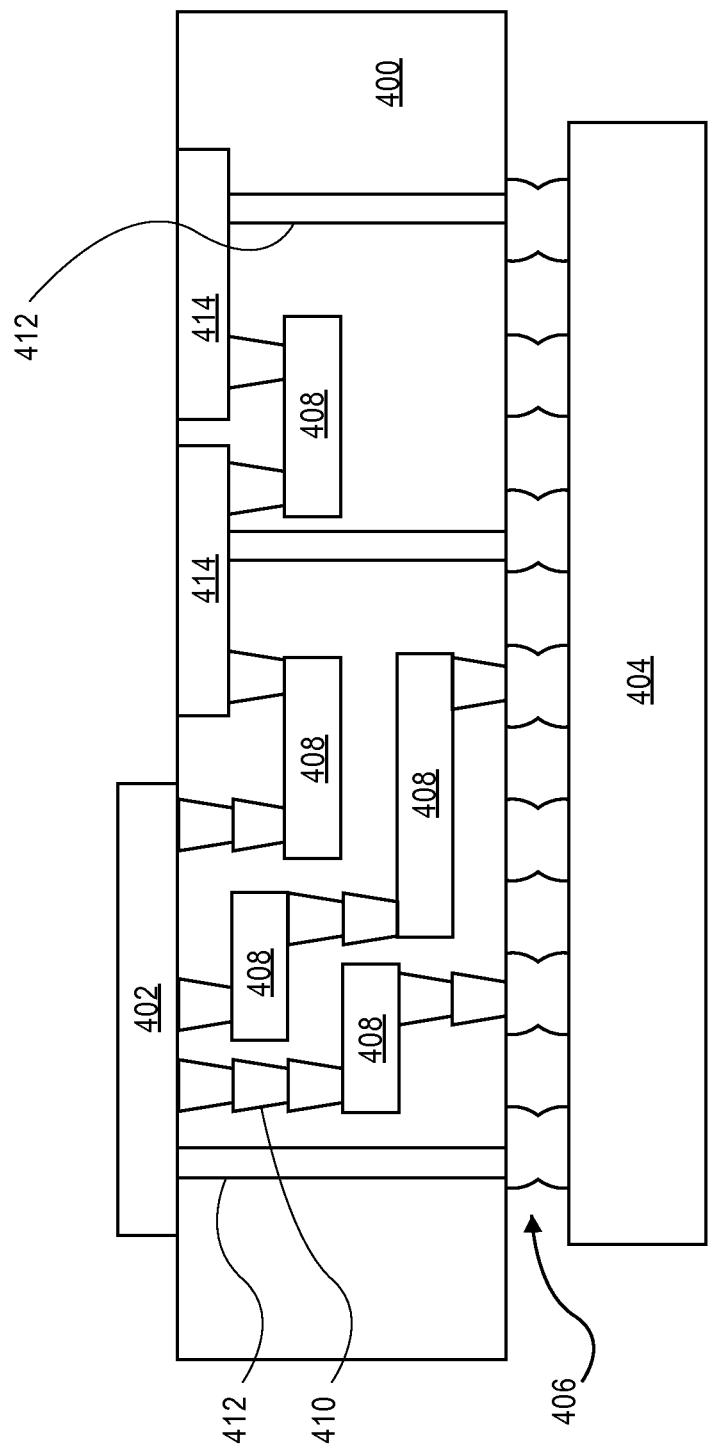
FIG. 12 is an interposer implementing one or more embodiments.

FIG. 12 illustrates interposer 400 that includes one or more embodiments. Interposer 400 is an intervening substrate used to bridge a first substrate 402 to second substrate 404. First substrate 402 may be, for instance, an integrated circuit die. Second substrate 404 may be, for instance, a memory module, a computer motherboard, or another integrated circuit die. Generally, the purpose of interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of interposer 400. In other embodiments, the first and second substrates 402/404 are attached to the same side of interposer 400. In further embodiments, three or more substrates are interconnected by way of interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 400.

In accordance with embodiments, apparatuses or processes disclosed herein may be used in the fabrication of interposer 400.

Figure 13:
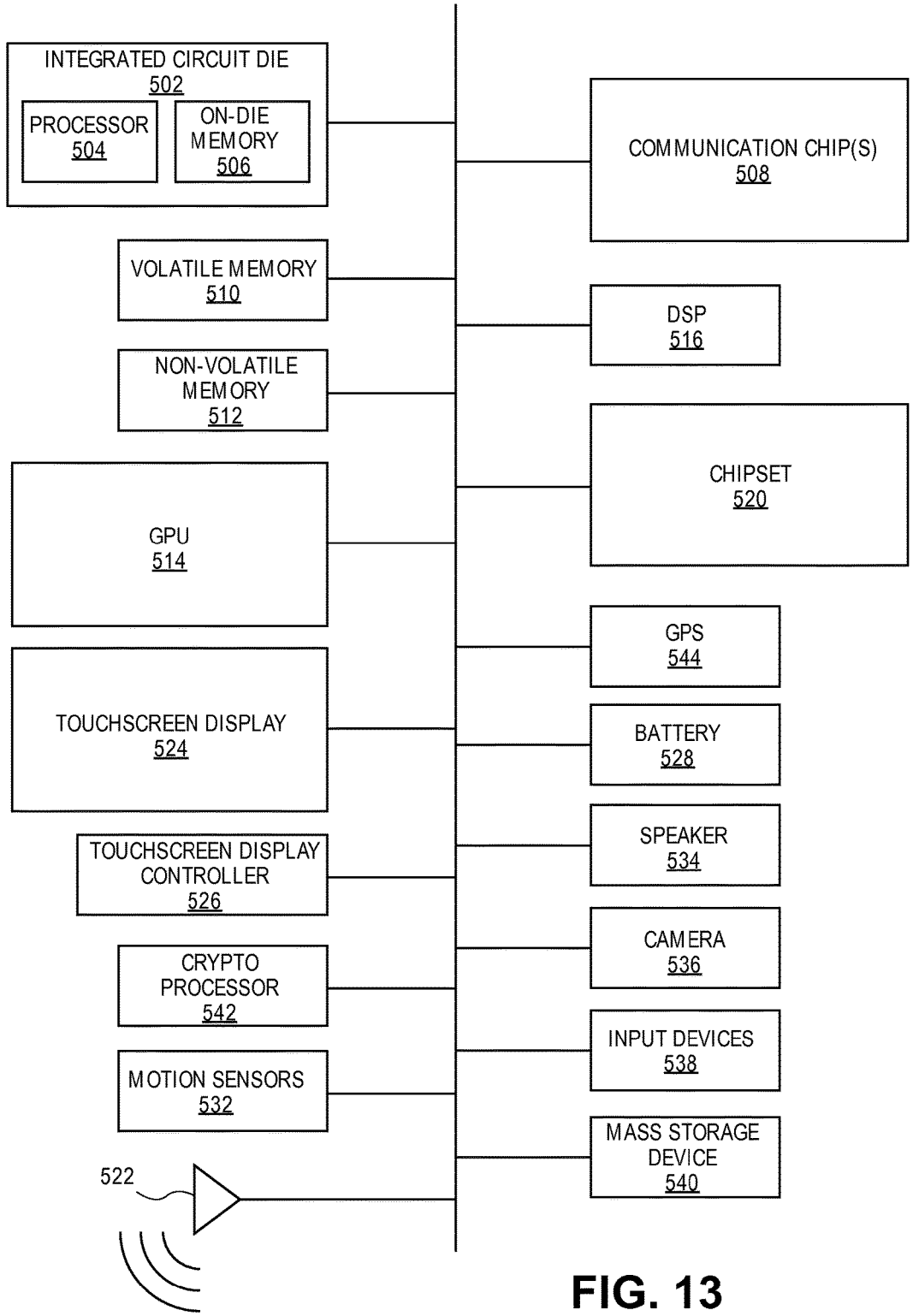
FIG. 13 illustrates an embodiment of a computing device.

FIG. 13 illustrates a computing device 500 in accordance with one embodiment. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 544, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors or metal interconnects, that are formed in accordance with embodiments including backside contacts to device and backside metallization. The term "processor" may refer to any device or portion of a device that processes electronic data from registers and/or memory to transform that electronic data into other electronic data that may be stored in registers and/or memory.

The communication chip 508 may also include one or more devices, such as transistors or metal interconnects, that are formed in accordance with embodiments including backside contacts to device and backside metallization.

In further embodiments, another component housed within the computing device 500 may contain one or more devices, such as transistors or metal interconnects, that are formed in accordance with implementations including backside contacts to device and backside metallization.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Examples

Example 1 is an apparatus including a circuit structure including a device stratum including a plurality of transistor devices each including a first side and an opposite second side; an inductor disposed on the second side of the structure; and a contact coupled to the inductor and routed through the device stratum and coupled to at least one of the plurality of transistor devices on the first side.

In Example 2, the inductor of the apparatus of Example 1 includes a magnetic inductor.

In Example 3, the device stratum of the apparatus of any of Example 1 or 2 is disposed on a substrate and the substrate is disposed between the device stratum and the supply line.

In Example 4, the contact of the apparatus of Example 3 is routed through the substrate.

In Example 5, the contact of the apparatus of any of Examples 1-4 includes a first contact, the apparatus further including at least one interconnect layer disposed on the second side of the structure and at least one second contact coupled to the at least one interconnect layer and disposed through the device stratum.

In Example 6, the apparatus of Example 5 further includes contact points disposed on the second side of the device stratum operable to be coupled to an external source and coupled to the at least one interconnect layer.

In Example 7, the inductor of the apparatus of any of Examples 1-6 is a voltage regulator, the apparatus further including at least one interconnect disposed on the second side of the device stratum operable to carry a power supply, the at least one interconnect coupled to the voltage regulator.

In Example 8, the apparatus of any of Examples 1-7 further includes at least one interconnect on the second side of the device stratum and coupled to the inductor, wherein the interconnect is coupled between the inductor and the contact.

Example 9 is a system including a package substrate including a supply connection; and a die coupled to the package substrate, the die including (i) a device stratum including a plurality of transistor devices each including a first side and an opposite second side; (ii) an inductor disposed on the second side of the structure; and (iii) a contact coupled to the inductor and routed through the device stratum and coupled to at least one of the plurality of transistor devices on the first side.

In Example 10, the inductor in the system of Example 9 is a magnetic inductor.

In Example 11, the device stratum in the system of any of Example 9 or 10 is disposed on a substrate and the substrate is disposed between the device stratum and the supply line.

In Example 12, the contact in the system of Example 11 is routed through the substrate.

In Example 13, the inductor in the system of any of Examples 9-11 includes a magnetic inductor, the die further including at least one interconnect disposed on the second side of the device stratum operable to carry a power supply, the at least one interconnect coupled to the magnetic inductor.

In Example 14, the magnetic inductor in the system of Example 13 includes a voltage regulator.

Example 15 is a method including forming a plurality of transistor devices on a substrate, the plurality of transistor devices defining a device stratum including a first side and an opposite second side, wherein the second side is coupled to the substrate; removing a portion of the substrate; forming at least one inductor on the second side of the device stratum; and coupling the at least one inductor to at least one of the plurality of transistor devices.

In Example 16, the inductor of the method of Example 15 includes a magnetic inductor.

In Example 17, removing a portion of the substrate of the method of any of Example 15 or 16 includes removing the entire portion of the substrate.

In Example 18, the method of any of Examples 15-17 further includes forming at least one interconnect on the second side of the device stratum; and coupling the at least one inductor to the at least one interconnect, wherein coupling the at least one inductor to at least one of the plurality of transistor devices includes coupling the at least one interconnect to the at least one of the plurality of transistor devices.

In Example 19, the method of Example 18 further includes forming contact points on the second side of the device stratum operable to be coupled to an external source and coupled to the at least one interconnect.

In Example 20, the at least one inductor of the method of Example 19 includes a voltage regulator.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a circuit structure comprising a device stratum comprising a plurality of transistor devices each comprising a first side and an opposite second side;
an inductor disposed on the second side of the structure; and
a contact coupled to the inductor and routed through the device stratum and coupled to at least one of the plurality of transistor devices on the first side, wherein the contact does not extend entirely through the device stratum.

2. The apparatus of claim 1, wherein the inductor comprises a magnetic inductor.

3. The apparatus of claim 1, wherein the device stratum is disposed on a substrate and the substrate is disposed between the device stratum and a supply line.

4. The apparatus of claim 3, wherein the contact is routed through the substrate.

5. The apparatus of claim 1, further comprising at least one interconnect layer disposed on the second side of the structure and at least one second contact coupled to the at least one interconnect layer.

6. The apparatus of claim 5, further comprising contact points disposed on the second side of the device stratum operable to be coupled to an external source and coupled to the at least one interconnect layer.

7. The apparatus of claim 1, wherein the inductor is a voltage regulator, the apparatus further comprising at least one interconnect disposed on the second side of the device stratum operable to carry a power supply, the at least one interconnect coupled to the voltage regulator.

8. The apparatus of claim 1, further comprising at least one interconnect on the second side of the device stratum and coupled to the inductor, wherein the interconnect is coupled between the inductor and the contact.

9. A system comprising:
a package substrate comprising a supply connection; and
a die coupled to the package substrate, the die comprising:
(i) a device stratum comprising a plurality of transistor devices each comprising a first side and an opposite second side;

(ii) an inductor disposed on the second side of the structure; and (iii) a contact coupled to the inductor and routed through the device stratum and coupled to at least one of the plurality of transistor devices on the first side, wherein the contact does not extend entirely through the device stratum.

10. The system of claim 9, wherein the inductor is a magnetic inductor.

11. The system of claim 9, wherein the device stratum is disposed on a substrate and the substrate is disposed between the device stratum and the supply line.

12. The system of claim 11, wherein the contact is routed through the substrate.

13. The system of claim 9, wherein the inductor comprises a magnetic inductor, the die further comprising at least one interconnect disposed on the second side of the device stratum operable to carry a power supply, the at least one interconnect coupled to the magnetic inductor.

14. The system of claim 13, wherein the magnetic inductor comprises a voltage regulator.

15. A method comprising:
forming a plurality of transistor devices on a substrate, the plurality of transistor devices defining a device stratum comprising a first side and an opposite second side, wherein the second side is coupled to the substrate;
removing a portion of the substrate;
forming at least one inductor on the second side of the device stratum; and
coupling the at least one inductor to at least one of the plurality of transistor devices with a contact, wherein the contact does not extend entirely through the device stratum.

16. The method of claim 15, wherein the inductor comprises a magnetic inductor.

17. The method of claim 15, wherein removing a portion of the substrate comprises removing the entire portion of the substrate.

18. The method of claim 15, further comprising:
forming at least one interconnect on the second side of the device stratum; and
coupling the at least one inductor to the at least one interconnect, wherein coupling the at least one inductor to at least one of the plurality of transistor devices comprises coupling the at least one interconnect to the at least one of the plurality of transistor devices.

19. The method of claim 18, further comprising forming contact points on the second side of the device stratum operable to be coupled to an external source and coupled to the at least one interconnect.

20. The method of claim 19, wherein the at least one inductor comprises a voltage regulator.

* * * * *